United States Patent [19]

Kim et al.

[11] Patent Number: 4,947,064
[45] Date of Patent: Aug. 7, 1990

[54] SEMICONDUCTOR DEVICE HAVING A TIME DELAY FUNCTION

[75] Inventors: Chang-Hyun Kim, Seoul; Won-Tae Choi, Busan, both of Rep. of Korea

[73] Assignee: SamSung Electronic Co., Ltd., Suwon, Rep. of Korea

[21] Appl. No.: 313,893

[22] Filed: Feb. 23, 1989

[30] Foreign Application Priority Data

Jun. 9, 1988 [KR] Rep. of Korea .................. 1988-6916

[51] Int. Cl.$^5$ ......................................... H03K 19/094
[52] U.S. Cl. .................................. 307/594; 307/581; 307/605
[58] Field of Search ....................... 307/605, 601–603, 307/606, 581, 574–577, 585, 279, 568, 449

[56] References Cited

U.S. PATENT DOCUMENTS

| | | | |
|---|---|---|---|
| 3,900,747 | 8/1975 | Yamazaki et al. | 307/304 |
| 4,087,044 | 5/1978 | Hofmann | 307/449 |
| 4,216,390 | 8/1980 | Stewart | 307/279 |
| 4,437,024 | 3/1984 | Wacyk | 307/270 |
| 4,508,983 | 4/1985 | Allgood et al. | 307/577 |
| 4,568,842 | 2/1986 | Koike | 307/279 |
| 4,578,600 | 3/1986 | Magee | 307/585 |
| 4,651,030 | 3/1987 | Mimoto | 307/449 |
| 4,806,804 | 2/1989 | O'Leary | 307/605 |
| 4,808,802 | 2/1989 | Okitaka et al. | 307/568 |

FOREIGN PATENT DOCUMENTS

| | | | |
|---|---|---|---|
| 2443490 | 3/1976 | Fed. Rep. of Germany | 307/571 |
| 2848265 | 5/1979 | Fed. Rep. of Germany | 307/571 |

OTHER PUBLICATIONS

Graig, "CMOS Timing Generator", IBM Technical Disclosure Bulletin, vol. 25, No. 4, Sep. 82, pp. 2249-2250.
"CMOS Delay Circuit", IBM Technical Disclosure Bulletin, vol. 27, No. 12, May 1985, pp. 7134-7135.
"Device Parameter Independent Delay Circuit", IBM Technical Disclosure Bulletin, vol. 31, No. 1, Jun. 1988, pp. 21-23.
Fink, "Electronics Engineers' Handbook", McGraw-Hill Book Company, Second edition, pp. (16-16)–(16-19).
Microelectronics–Multiphase Clocking, 6-10-68, p. 52.

*Primary Examiner*—Stanley D. Miller
*Assistant Examiner*—Terry Cunningham
*Attorney, Agent, or Firm*—Robert E. Bushnell

[57] ABSTRACT

A delay circuit for a semiconductor integrated circuit having an unvaried delay time without the deterioration of a signal propagation characteristic under the influence of a voltage source and an ambient temperature. The semiconductor device includes a first complementary metal-oxide-semiconductor (CMOS) inverter including a first P-channel transistor and a first N-Channel transistor serially connected with said first P-channel transistor, a first junction field effect transistor (JFET) connected between a source of said first P-channel transistor and a first voltage source terminal, a gate of said first N-channel JFET being connected to the first voltage source terminal, a second JFET connected between a source of said first N-channel transistor and a second voltage source terminal, a gate of said second JFET being connected to the second voltage source terminal, a second CMOS inverter including a second P-channel transistor and a second N-channel transistor serially connected to said second P-channel transistor, a third JFET connected between a source of said second P-channel transistor and the first voltage source terminal, a gate of said third JFET being connected to the first voltage source terminal, and a fourth JFET connected between a source of said second N-channel transistor and the second voltage source terminal, a gate of said fourth JFET being connected to the second voltage source terminal, wherein drains of said first P-channel and N-channel transistors are connected to gates of said second P-channel and N-channel transistors.

20 Claims, 3 Drawing Sheets

FIG. 3C PRIOR ART
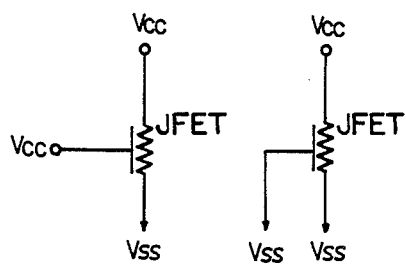
FIG. 3D PRIOR ART
FIG. 3E PRIOR ART
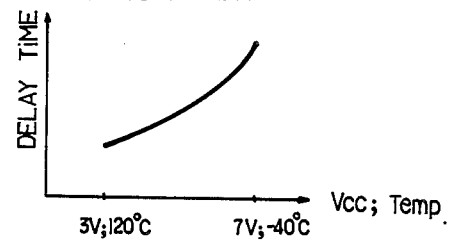
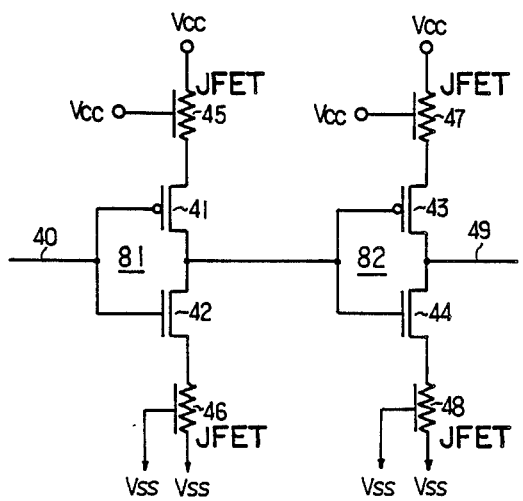
FIG. 4

4,947,064

SEMICONDUCTOR DEVICE HAVING A TIME DELAY FUNCTION

BACKGROUND OF THE INVENTION

The present invention relates to a semiconductor device having a time delay function and in particular to a semiconductor time-delay circuit capable of delaying an input signal for a fixed time duration regardless of potential level of an applied source supply voltage.

In general, a semiconductor device requires a fixed or predetermined time delay suited for its application. For this purpose, there has been used a metal-oxide-semiconductor field-effect-transistor (MOSFET), i.e. CMOS-type inverter.

In the prior art, a typical semiconductor device which will be later explained, a delay time thereof varies depending on a voltage source and temperature, which is apparently disadvantageous from the viewpoint of a signal propagation characteristic.

SUMMARY OF THE INVENTION

An object of the present invention is, therefore, to provide a delay circuit for a semiconductor integrated circuit having an unvaried delay time without the deterioration of a signal propagation characteristic under the influence of a voltage source and ambient temperature.

According to the present invention, a semiconductor device having a time delay function includes: a first complementary metal-oxide-semiconductor (CMOS) inverter having a first P-channel transistor and a first N-channel transistor serially connected with said first P-channel transistor; an input terminal connected to gates of said first P-channel and N-channel transistors and receiving an input signal; a first voltage source terminal supplied with a positive power source; a first junction field effect transistor (JFET) connected between a source of said first P-channel transistor and said first voltage source terminal, a gate of said first N-channel JFET being connected to said first voltage source terminal; a second voltage source terminal supplied with a reference power source; a second junction field effect transistor connected between a source of said first N-channel transistor and said second voltage source terminal, a gate of said second JFET being connected to said second voltage source terminal; a second complementary metal-oxide-semiconductor (CMOS) inverter including a second P-channel transistor and a second N-channel transistor serially connected to said second P-channel transistor; an output terminal connected to drains of said second P-channel and N-channel transistors and producing a predetermined time delay signal; a third junction field effect transistor connected between a source of said second P-channel transistor and said first voltage source terminal, a gate of said third JFET being connected to said first voltage source terminal; and a fourth junction field effect transistor connected between a source of said second N-channel transistor and said second voltage source terminal, a gate of said fourth JFET being connected to said second voltage source terminal, wherein drains of said first P-channel and N-channel transistors are connected to gates of said second P-channel and N-channel transistors.

BRIEF DESCRIPTION OF THE DRAWINGS

The present invention will be more clearly understood from the description as set forth below with reference to the accompanying drawings, wherein:

FIGS. 3C and 3D are circuit diagrams of N-channel and P-channel junction field effect transistors to be used in the present invention, respectively;

FIG. 3E is a graph showing at an output terminal of the circuit of FIG. 3C a relationship between a delay time and a power source and temperature;

FIG. 4 is a circuit diagram of a preferred embodiment of the present invention;

DETAILED DESCRIPTION OF THE PREFERRED EMBODIMENTS

Before the description of the present invention, a prior art circuit will be explained with reference to FIGS. 1 and 2.

Figure 1:
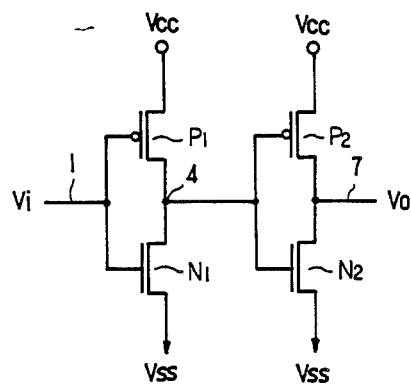
FIG. 1 is a circuit diagram illustrating a prior art delay circuit.

FIG. 1 is a circuit diagram of a prior art delay circuit. An input signal Vi is supplied to gates of P-channel metal oxide semiconductor (MOS) field effect transistors (hereinafter simply referred to as FET) P1 and N-channel N1 through a terminal 1. The FETs P1 and N1 construct an inverter, and similarly the FETs P2 and N2 construct an inverter. Further, the FETs P1, P2, N1, and N2 construct an inverter circuit. Drains of the FETs P1 and N1 are connected to gates of the FETs P2 and N2. Sources of the FETs P1 and P2 are connected to a positive power source Vcc, and sources of the FETs N1 and P2 are connected to a ground-level power source Vss. An output signal Vo with a predetermined delay time appears at a terminal 7 coupled to drains of the FETs P2 and N2. The input signal Vi delivered from an external source as shown in FIG. 1 is applied to gates of the FETs P1 and N1. The inverted signal appears at drains of the FETs P1 and N1 and is supplied to gates of the FETs P2 and N2. Therefore, the output of an inverter circuit is produced from a terminal 7 and is the same waveform as an input signal but with a predetermined delay time. A time duration of the delay time is identical to a total time taken by an applied input signal to pass through a terminal 2, via two inverter. By an with the inherent characteristic of the devices in the inverter circuit as described above, the delaying time duration of the corresponding resistance component to a time delay may exhibit a great variation in accordance with a potential level of a power source, compared with a pure resistance component.

Figure 2:
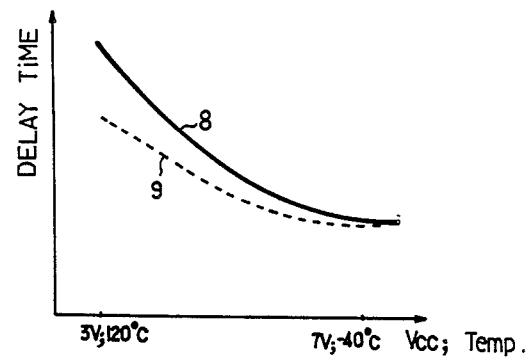
FIG. 2 is a graph showing at an output terminal of the circuit of FIG. 1, a relationship between a delay time and a power source and temperature.

In FIG. 2, which is a graph for showing an output characteristic in case that a conventional delay is used, an abscissa denotes a power source and an ambient temperature, and a vertical axis denotes a delay time. The curve 8 is to explain that a delay time duration varies depending on a power source and a temperature, and more particularly to illustrate a rapid drop in a range of a low-voltage/high-temperature, thereby resulting in a great difference in operational velocity in the device.

On the other hand, a sheet resistance may be provided between a MOS FET and a positive power source or a ground-level power source, for reducing a variation in width of a delay time. The resulting characteristic are shown in a curve 9 as shown in FIG. 2.

Figure 3A:
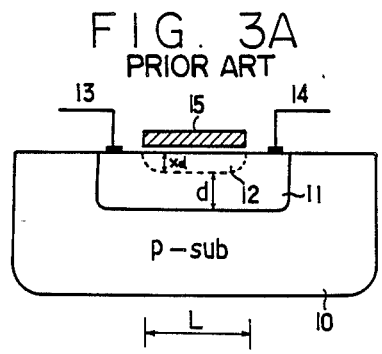
FIGS. 3A and 3B are cross-sectional views of N-channel and P-channel junction field effect transistors, respectively.
Figure 3B:
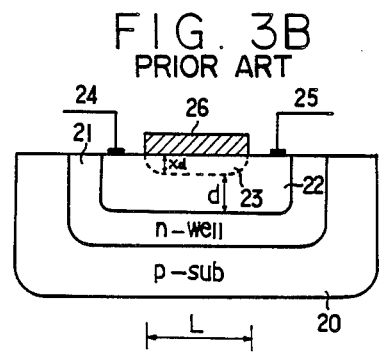

FIGS. 3A through 3E show a junction field effect transistor (hereinafter simply referred to as JFET) to be used in the present invention, wherein FIGS. 3A and 3B are cross-sectional views of N-channel and P-channel JFETs, respectively; FIG. 3C is a circuit diagram of a N-channel JFET, of which a gate and a drain are connected to a positive power source, and a source is provided to a negative power source (i.e. ground voltage); FIG. 3D is a circuit diagram of P-channel JFET, of which a drain is supplied with a positive power source Vcc, and a gate and source are coupled to from the negative power source Vss; and FIG. 3E is a graph for showing output characteristics of the circuit of FIG. 3C.

Further, each resistance component shown in FIGS. 3C and 3D is determined by the applied gate voltage. FIG. 3A shows a gate electrode 15 formed on a P-type substrate 10 in the N-channel JFET which is electrically insulated from a gate 12, and FIG. 3B shows a gate electrode 26 formed on a P-type substrate 20 in a P-channel JFET which is in directly contact with another gate 23.

Even through a gate voltage is not applied to gate electrodes 15 and 26 of said JFETs, a voltage signal is respectively transmitted from first electrodes 13, 24 to second electrodes 14, 15 with a resistance component produced by a dose of injection ions into a n− region 11 or p+ region 22.

The equation for a resistance component is given below:

$$R = \rho \frac{L}{d \cdot w} \quad (1)$$

where,
L=gate electrode length
W=gate electrode width (not shown in FIGS. 3A and 3B),
d=n− region or p+ region depth,
ρ=resistivity.

A depletion region Xd is increased by increasing a gate voltage, and thereby p+ region 22 and n− region 11 depths d are gradually reduced. Consequently, this is to cause a resistance component to be increased, in which an equation for the depletion region depth Xd is as follow:

$$Xd = \frac{Esi}{Cox} \cdot \left[ \sqrt{1 + \frac{2Cox^2}{Esi \cdot q \cdot Nd} (V1 + V2)^{-1}} \right] \quad (2)$$

where,
Esi=dielectricity of silicon
Cox=capacitance per unit area of an insulating material for insulating between a gate electrode and a gate,
q=quantity of charges,
Nd=impurity concentration in channel region 11,
V1=voltage applied to a source or a gate,
V2=voltage applied to a gate electrode.

As is well known to an ordinary expert in the art, the depletion region depth Xd of the JFET in which the gate and the gate electrode are in contact with each other, is substantially the same as a depletion region depth in a general p−n junction. Further, though not referred to in the above embodiment, a N-channel JFET having electrical isolation between a gate electrode and a gate thereof and a P-channel JFET having direct contact between a gate electrode and a gate thereof, may be applied to the present invention as another embodiment.

As is well seen from FIG. 3E, which is a graph for showing an output characteristic of the circuit of FIG. 3C, the output characteristics of a JFET are contrary to those of a MOS FET shown in a FIG. 2. That is, in MOS FET the more the applied voltage thereto increases, the less a resistance component becomes, while in a JFET the more the applied voltage thereto increases, the more a resistance component becomes. As a result, a combination of MOS FET and JFET may exhibit a constant value of a resistance component, i.e. a delay time in case of the applied voltage, the delay time being not subjected to the influence of a power source voltage. Therefore, a delay circuit having a predetermined delay time can be constructed.

Figure 5:
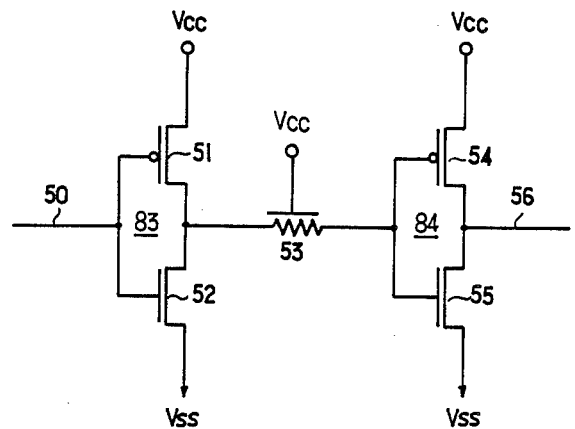
FIG. 5 is a circuit diagram of another embodiment of the present invention.

A description is given of preferred embodiments of the present invention with reference to FIGS. 4 and 5, wherein FIG. 4 is a circuit diagram of a delay circuit using a combination of MOS FETs and JFETs of a preferred embodiment according to the present invention, and FIG. 5 is a circuit diagram of another embodiment of the present invention.

A JFET can be made so as to show the high resistance characteristics when a positive power source Vcc is connected to a gate, while a JFET can be made so as to show the low resistance characteristics when a negative power source Vss is connected to a gate. Referring to FIG. 4, a delay circuit includes two conventional complementary metal-oxide-semiconductor (CMOS) inverters 81 and 82, each of the inverters including a P-channel MOS transistor (PMOS) and a N-channel MOS (NMOS) transistor. A junction field effect transistor (JFET) is connected between a source of the PMOS 41 and a positive power source Vcc, and similarly a JFET 47 is connected between a source of the PMOS 43 and the positive power source Vcc. Gates of the JFETs are also connected to the positive power source. Further, a junction field effect transistor (JFET) 46 is connected between a source of NMOS 42 and a negative power source Vss, and a JFET 48 is also connected between a source of the NMOS 44 and the negative power source Vss. Gates of the JFETs are also connected to the negative power source Vss. The JFETs 45, 47 will be preferably N-types, while the JFETs 46, 48 will be P-types.

FIG. 5 shows a circuit of another preferred embodiment of the present invention. A delay circuit includes two conventional complementary metal-oxide-semiconductor (CMOS) inverters 83 and 84, each of the inverters comprising a P-channel MOS transistor and a N-channel MOS transistor. The delay circuit also includes a N-channel junction field effect transistor 53 connected between drains of the MOS 51, 52 and gates of the MOS 54, 55. The JFET 53 may be replaced by a P-channel JFET whose gate is connected to the ground voltage Vss.

Figure 6:
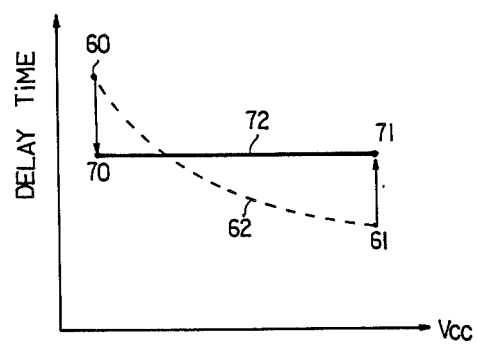
FIG. 6 is a graph showing comparisons between currently available delay circuit and delay circuits made according to the principles of the currently disclosed inventions.

In FIG. 6, which shows a characteristic curve of a delay circuit according to the present invention, a straight line 72 linked by two points 70 and 71 indicates the output characteristics of the circuit of FIG. 4, whereas a curve 62 linked by two points 60 and 61 indicates the characteristics of a delay circuit using two successive CMOS inverters of the prior art. By the inherent characteristics of a N-channel JFET in FIG. 4, the reducing of a resistance component makes a short delay time in case of a falling positive power source, namely, the point 60 is shifted to the point 70 as shown in FIG. 6, while in case of a rising positive power source the increasing of a resistance component makes a long delay time, namely, the point 61 is shifted to the point 71 as shown in FIG. 6.

As is apparent from the aforementioned description, a delay circuit of the present invention, using a combination of a CMOS inverter and a JFET, can be constructed so that predetermined signal propagation charateristics can be obtained without the variation of a time delay upon the change of a power source voltage and an ambient temperature. Furthermore, the present invention can be used for controlling a velocity of operation of a semiconductor device.

The present invention is not limited to the embodiments aforementioned, and variation and modification may be made without departing from the scope of the present invention.

What is claimed is:

1. A semiconductor device having a time delay function comprising:
    a first complementary metal-oxide-semiconductor (CMOS) inverter including a first P-channel transistor and a first N-channel transistor serially connected with said first P-channel transistor;
    an input terminal connected to gates of said first P-channel and N-channel transistors and receiving an input signal;
    a first voltage source terminal supplied with a positive power source;
    a first junction field effect transistor (JFET) connected between a source of said first P-channel transistor and said first voltage source terminal, a gate of said first N-channel JFET being connected to said first voltage source terminal;
    a second voltage source terminal supplied with a reference power source;
    a second junction field effect transistor connected between a source of said first N-channel transistor and said second voltage source terminal, a gate of said second JFET being connected to said second voltage source terminal;
    a second complementary metal-oxide-semiconductor (CMOS) inverter including a second P-channel transistor and a second N-channel transistor serially connected to said second P-channel transistor;
    an output terminal connected to drains of said second P-channel and N-channel transistors and producing a predetermined time delay signal;
    a third junction field effect transistor connected between a source of said second P-channel transistor and said first voltage source terminal, a gate of said third JFET being connected to said first voltage source terminal; and
    a fourth junction field effect transistor connected between a source of said second N-channel transistor and said second voltage source terminal, a gate of said fourth JFET being connected to said second voltage source terminal, wherein drains of said first P-channel and N-channel transistors are connected to gates of said second P-channel and N-channel transistors.

2. The semiconductor device of claim 1, wherein said first and third JFETs are N-type and said second and fourth JFETs are P-type, respectively.

3. A semiconductor device having a time delay function comprising:
    a first complementary metal-oxide semiconductor inverter including a first P-channel transistor and a first N-channel transistor connected in series with said first P-channel transistor;
    an input terminal connected to gate of said first P-channel and N-channel transistors and receiving an input signal;
    a first voltage source terminal supplied with a positive power source;
    a second voltage source terminal supplied with a reference power source;
    a second complementary metal-oxide-semiconductor inverter including a second P-channel transistor and a second N-channel transistor connected in series to said second P-channel transistor;
    an output terminal connected to drains of said second P-channel and N-channel transistors and producing a predetermined time delay signal; and
    a junction field effect transistor connected between a common drain of said first P-channel and N-channel transistors and a common gate of said second P-channel and N-channel transistors;
    wherein sources of said first P-channel transistor and said second P-channel transistor are connected to the first voltage source terminal, and sources of said first N-channel transistor and said second N-channel transistor are connected to the second voltage source terminal.

4. The semiconductor device of claim 3, further comprised of said junction field effect transistor having a N-channel.

5. The semiconductor device of claim 3, further comprised of said junction field effect transistor having a P-channel.

6. The semiconductor device of claim 3, further comprised of said junction field effect transistor having a N-channel and a gate connectable to the positive power source.

7. The semiconductor device of claim 3, further comprised of said junction field effect transistor having a P-channel and a gate connectable to the reference power source.

8. The semiconductor device of claim 1, further comprised of said first and third junction field effect transistors having N-channels.

9. The semiconductor device of claim 1, further comprised of said second and fourth junction field effect transistors having P-channels.

10. A semiconductor device, comprising:
    a first complementary metal-oxide-silicon transistor pair including a first and a second metal-oxide-silicon transistor wherein said first metal-oxide-silicon transistor is a P-channel and said second metal-oxide-silicon transistor is an N-channel, with a first channel electrode of said first metal-oxide-silicon transistor serially coupled with a first channel electrode of said second metal-oxide-silicon transistor, and with gates of said first and second metal-oxide-silicon transistors being coupled together;

a first junction field effect transistor connected between a second channel electrode of said first metal-oxide-silicon transistor and a first voltage source terminal, a gate of said first junction field effect transistor being connected to said first voltage source terminal;

a second junction field effect transistor connected between a second channel electrode of said second metal-oxide-silicon transistor and a second voltage source terminal, a gate of said second junction field effect transistor being connected to said second voltage source terminal;

a second complementary metal-oxide-silicon transistor pair including a third and a fourth metal-oxide-semiconductor transistor wherein said third metal-oxide-silicon transistor is a P-channel and said fourth metal-oxide-silicon transistor is an N-channel, with a P-channel of said third metal-oxide-silicon transistor serially coupled with a N-channel of said fourth metal-oxide-silicon transistor, and with gates of said third and fourth metal-oxide-silicon transistors being coupled to the first channel electrodes of said first and second metal-oxide-transistor;

a third junction field effect transistor connected between a second channel electrode of said third metal-oxide-silicon transistor and a first voltage source terminal, a gate of said third junction field effect transistor being connected to said first voltage source terminal; and a fourth junction field effect transistor connected between a second channel electrode of said fourth metal-oxide-silicon transistor and a second voltage source terminal, a gate of said fourth junction field effect transistor being connected to said second voltage source terminal.

11. The semiconductor device of claim 10, further comprised of said first and third junction field effect transistors having N-channels.

12. The semiconductor device of claim 10, further comprised of said second and fourth junction field effect transistors having P-channels.

13. The semiconductor device of claim 11, further comprised of said second and fourth junction field effect transistors having P-channels.

14. A semiconductor device, comprising:
a first complementary metal-oxide-silicon transistor pair including a first and a second metal-oxide-silicon transistor with a P-channel of said first metal-oxide-silicon transistor serially coupled at a first node with a N-channel of said second metal-oxide-silicon transistor, with said P-channel of said first metal-oxide-silicon transistor and N-channel of said second metal-oxide-silicon transistor being coupled between first and second voltage source terminals, and with gates of said first and second metal-oxide-silicon transistors being coupled together;

a second complementary metal-oxide-silicon transistor pair including a third and a fourth metal-oxide-semiconductor transistor with a P-channel of said third metal-oxide-silicon transistor serially coupled with a N-channel of said fourth metal-oxide-silicon transistor, with said P-channel of said third metal-oxide-silicon transistor and N-channel of said fourth metal-oxide-silicon transistor being coupled between said first and second voltage source terminals, and with gates of said third and fourth metal-oxide-silicon transistors being coupled together at a second node; and a junction field effect transistor connected between said first and second nodes, with a gate of said junction field effect transistor being connected to said first voltage source terminal.

15. The semiconductor device of claim 14, further comprised of said junction field effect transistor having a N-channel and a gate connectable to the first voltage terminal.

16. The semiconductor device of claim 14, further comprised of said junction field effect transistor having a P-channel and a gate connectable to the second voltage terminal.

17. A semiconductor device, comprising:
a first junction field effect transistor having one channel electrode and a gate connected to a first voltage source terminal;

a second junction field effect transistor having one channel electrode and a gate connected to a second voltage source terminal;

a first complementary metal-oxide-silicon transistor pair including a first and a second metal-oxide-silicon transistor with a P-channel of said first metal-oxide-silicon transistor serially coupled at a first node with a N-channel of said second metal-oxide-silicon transistor between second channel electrodes of said first and second junction field effect transistors, and with gates of said first and second metal-oxide-silicon transistors being coupled together;

a third junction field effect transistor having one channel electrode and a gate connected to said first voltage source terminal;

a fourth junction field effect transistor having one channel electrode and a gate connected to said second voltage source terminal;

a second complementary metal-oxide-silicon transistor pair including a third and a fourth metal-oxide-semiconductor transistor with a P-channel of said third metal-oxide-silicon transistor serially coupled with a N-channel of said fourth metal-oxide-silicon transistor between second channel electrodes of said third and fourth junction field effect transistors, and with gates of said third and fourth metal-oxide-silicon transistors being coupled together to said first node.

18. The semiconductor device of claim 17, further comprised of said first and third junction field effect transistors having N-channels.

19. The semiconductor device of claim 17, further comprised of said second and fourth junction field effect transistors having P-channels.

20. The semiconductor device of claim 18, further comprised of said second and fourth junction field effect transistors having P-channels.

* * * * *